United States Patent
Ahn et al.

(10) Patent No.: US 10,269,665 B2
(45) Date of Patent: Apr. 23, 2019

(54) SEMICONDUCTOR DEVICE FOR SENSOR APPLICATION USING CONTACTS LOCATED ON TOP SURFACE AND BOTTOM SURFACE AND METHOD FOR FABRICATING THEREOF

(71) Applicant: Seoul National University R&DB Foundation, Seoul (KR)

(72) Inventors: Jin Hong Ahn, Gyeonggi-do (KR); Young June Park, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 317 days.

(21) Appl. No.: 15/016,630

(22) Filed: Feb. 5, 2016

(65) Prior Publication Data

US 2016/0155678 A1 Jun. 2, 2016

Related U.S. Application Data

(63) Continuation of application No. PCT/KR2014/007201, filed on Aug. 5, 2014.

(30) Foreign Application Priority Data

Aug. 5, 2013 (KR) .................. 10-2013-0092703

(51) Int. Cl.
*H01L 27/092* (2006.01)
*H01L 21/66* (2006.01)
(Continued)

(52) U.S. Cl.
CPC ............ *H01L 22/32* (2013.01); *B82Y 15/00* (2013.01); *G01R 27/02* (2013.01);
(Continued)

(58) Field of Classification Search
CPC ....... H01L 27/0928; H01L 2027/11855; H01L 2027/11861; H01L 29/732
See application file for complete search history.

(56) References Cited

U.S. PATENT DOCUMENTS 5,473,183 A * 12/1995 Yonemoto ........... H01L 27/0928
257/371
6,144,075 A * 11/2000 Chi ..................... H01L 27/0928
257/368
(Continued)

FOREIGN PATENT DOCUMENTS

JP 2006-253467 A 9/2006
JP 2009-272552 A 11/2009
(Continued)

*Primary Examiner* — Stephen W Smoot
(74) *Attorney, Agent, or Firm* — Mintz Levin Cohn Ferris Glovsky and Popeo, P.C.; Kongsik Kim; Jhongwoo Jay Peck

(57) ABSTRACT

A semiconductor device and a method of fabricating the same are disclosed. A semiconductor device according to an embodiment of the present invention includes: a first type doped semiconductor substrate; a second type doped deep well configured such that one or more semiconductor device elements are formed therein; a first type doped first well formed inside a region surrounded by the deep well of the one surface of the semiconductor substrate, and separated from the semiconductor substrate by the deep well; a first electrical contact formed on a part of the one surface of the semiconductor substrate, and electrically connected to the first well; and a second electrical contact formed on another surface of the semiconductor substrate.

9 Claims, 11 Drawing Sheets

(51) Int. Cl.
*H01L 29/732* (2006.01)
*B82Y 15/00* (2011.01)
*H01L 21/8238* (2006.01)
*H01L 27/06* (2006.01)
*G01R 27/02* (2006.01)
*H01L 23/00* (2006.01)
*H01L 29/06* (2006.01)

(52) U.S. Cl.
CPC ...... *H01L 21/823892* (2013.01); *H01L 22/20* (2013.01); *H01L 24/27* (2013.01); *H01L 24/29* (2013.01); *H01L 24/43* (2013.01); *H01L 24/45* (2013.01); *H01L 27/0629* (2013.01); *H01L 27/0928* (2013.01); *H01L 29/0646* (2013.01); *H01L 29/732* (2013.01); *H01L 2924/00014* (2013.01)

(56) References Cited

U.S. PATENT DOCUMENTS

| | | | |
|---|---|---|---|
| 7,088,168 | B2 | 8/2006 | Lee et al. |
| 8,269,566 | B2 | 9/2012 | Upadhyaya et al. |
| 8,546,883 | B2 | 10/2013 | Cha et al. |
| 2003/0178683 | A1* | 9/2003 | Hayashi .............. H01L 27/0928 257/368 |
| 2004/0227183 | A1* | 11/2004 | Negoro ........... H01L 21/823892 257/338 |
| 2005/0087813 | A1 | 4/2005 | Lee et al. |
| 2008/0029782 | A1 | 2/2008 | Carpenter et al. |
| 2011/0049563 | A1* | 3/2011 | Oh ...................... H01L 27/0705 257/140 |
| 2015/0014704 | A1* | 1/2015 | Konrath .............. H01L 29/7322 257/77 |
| 2017/0154957 | A1* | 6/2017 | Mallikarjunaswamy ................... H01L 29/0646 |

FOREIGN PATENT DOCUMENTS

| | | |
|---|---|---|
| KR | 10-0975972 B1 | 8/2010 |
| KR | 10-2010-0129600 A | 12/2010 |
| KR | 10-2011-0054320 A | 5/2011 |
| KR | 10-2011-0078930 A | 7/2011 |
| KR | 10-2012-0083125 A | 7/2012 |
| KR | 10-2013-0050975 A | 5/2013 |

* cited by examiner

SEMICONDUCTOR DEVICE FOR SENSOR APPLICATION USING CONTACTS LOCATED ON TOP SURFACE AND BOTTOM SURFACE AND METHOD FOR FABRICATING THEREOF

CROSS-REFERENCE TO RELATED APPLICATION

This application is a continuation of PCT/KR2014/007201 filed on Aug. 5, 2014, which claims priority to Korean Application No. 10-2013-0092703 filed on Aug. 5, 2013, which application is incorporated herein by reference.

TECHNICAL FIELD

The present invention relates to semiconductor devices and, more particularly, to a semiconductor device and a method of fabricating the same, which can supply power to the semiconductor device and provide input/output terminal via only two electrode connections on front and back surfaces using the deep well process of a complementary metal-oxide semiconductor (CMOS) process without requiring pads.

BACKGROUND ART

In the initial stage of the development of semiconductor device fabricating technology, germanium Ge was the most desirable semiconductor material. However, from the early 1960s, germanium Ge started to be rapidly replaced by silicon Si, and Si has become material that takes lead in semiconductor integrated circuit technology.

With regard to the CMOS process using Si, an n-well process in which an n-MOSFET is implemented in a p-type silicon substrate and an n-well is formed to implement a p-MOSFET is used, a p-well process in which a p-well is formed in an n-type silicon substrate, and a twin-well process in which both an n-well and a p-well are formed in a substrate doped at a low concentration. Using the twin-well process, the performances of a p-MOSFET and an n-MOSFET can be optimized, and the reliability problem of a substrate region having a low dopant concentration, called latch-up, can be overcome.

Generally, a CMOS transistor is configured such that an n-channel MOS transistor and a p-channel MOS transistor are connected to each other and operate in conjunction with each other. A conventional method of fabricating a CMOS transistor is described below.

First, an isolation layer is formed on a silicon substrate, i.e., a semiconductor substrate, using a LOCal Oxidation of Silicon (LOCOS) or Shallow Trench Isolation (STI) process. Furthermore, an n-well is formed by injecting phosphorus P, i.e., n-type dopant, into the semiconductor substrate through a low-concentration ion injection process, and a p-well is formed by ion-injecting boron B, i.e., p-type dopant, into an adjacent portion of the semiconductor substrate.

A gate insulation film is deposited above the n-well and p-well of the semiconductor substrate, poly-silicon is deposited on the gate insulation film as conductive material, and these are patterned by a dry etching process using a gate mask. Accordingly, the gate insulation film and a gate electrode are stacked above the n-well, and the gate insulation film and a gate electrode are stacked above the p-well.

Thereafter, an LDD ion injection process is performed on each of the wells using the gate electrode as a mask, and a silicon nitride layer is deposited on all the surfaces of the substrate as insulating material and then dry-etched, thereby forming a spacer on a side surface of the gate electrode of the n-well and a spacer on a side surface of the gate electrode of the p-well.

Thereafter, a source/drain ion injection process is performed on each of the wells using the gate electrode and the spacer as a mask, and thus a $p^+$-type source/drain junction layer into which high-concentration p-type dopant has been injected is formed inside the n-well and an $n^+$-type source/drain junction layer into which high-concentration n-type dopant has been injected is formed inside the p-well. The CMOS process is completed by performing a metallization process of connecting the above junction layers.

After the CMOS semiconductor device has been manufactured by the CMOS fabricating process, a passivation layer for protecting a chip is deposited, and then bonding pads used to connect the CMOS semiconductor device to the lead frame of a package for packaging the CMOS semiconductor using thin metallic wires are formed by etching the passivation layer using a mask.

However, the conventional CMOS fabricating technology requires a packaging process, such as bumping based on wire bonding or ball formation, and a separate mask process adapted to deal with the loss of an area attributable to pads and the formation of pads because semiconductor terminals are always connected to a system via pads.

Furthermore, the conventional technology suffers from difficulty in the configuration of a system due to the three-dimensional (3D) structure of a packaging portion for forming pads, and is problematic in that it is impossible to rapidly measure an unprocessed chip itself when needed.

Moreover, the conventional technology is problematic in that it is difficult to preserve nano-material on a surface when it is used as a sensor because the conventional technology entails a structure in which chip surfaces are not easily exposed.

Recently, with the development of semiconductor fabricating technology, very small-sized nano-devices have been implemented, and the application fields of semiconductor devices have been considerably diversified. Therefore, there is a growing need for the development of a semiconductor device without pads in some application fields in order to overcome the problems attributable to the formation of pads.

SUMMARY OF THE DISCLOSURE

Accordingly, the present invention has been made to solve the above problems occurring in the prior art, and an object of the present invention is to provide a semiconductor device and a method of fabricating the same, which can supply power to the semiconductor device and provide input and output terminals via only two electrode connections on front and back surfaces using the deep well process of a CMOS process without pads.

Furthermore, an object of the present invention is to provide a semiconductor device and a method of fabricating the same, which can eliminate pads, thereby minimizing the size of the device, and also reducing fabricating costs by reducing the number fabricating processes.

Furthermore, an object of the present invention is to provide a semiconductor device and a method of fabricating the same, which can eliminate a pad process (including the process of patterning pads, and the bonding and bumping process of connecting pads and external terminals), thereby simplifying processes and also improving characteristics in connection with a sensor that is manufactured by coating the surfaces thereof with nano-material or the like.

Furthermore, an object of the present invention is to provide a semiconductor device and a method of fabricating the same, in which electrically conductive material (whose electrical conductivity may vary depending on the environmental condition), such as carbon nano-tubes, used to detect surrounding material is applied after a semiconductor process in a high-temperature environment, such as a metallization process, has been performed, thereby improving the reliability of sensing without changing the characteristics of electrically conductive material.

In accordance with an aspect of the present invention, there is provided a semiconductor device, including: a first type doped semiconductor substrate; a second type doped deep well configured such that one or more semiconductor device elements are formed therein, and formed from one surface of the semiconductor substrate to the inside of the semiconductor substrate; a first type doped first well formed inside a region surrounded by the deep well of the one surface of the semiconductor substrate, and separated from the semiconductor substrate by the deep well; a first electrical contact formed on a part of the one surface of the semiconductor substrate, and electrically connected to the first well; and a second electrical contact formed on another surface of the semiconductor substrate.

The semiconductor device may receive power and also receive and transmit data using the first and second electrical contacts.

The first electrical contact may correspond to a relative reference electric potential that determines a deep well electric potential based on the second electrical contact. That is, the first electrical contact may correspond to a GND electric potential when the deep well electric potential corresponds to VDD, whereas the first electrical contact may correspond to a VDD electric potential when the deep well electric potential corresponds to GND.

The first electrical contact may be a metal wire electrically connected to the first well, and the second electrical contact may be a metal plate coated onto the semiconductor substrate.

The semiconductor device may further include a capacitor formed between the deep well and the first electrical contact, and the first electrical contact and the second electrical contact may be separated by a first p-n junction formed between the semiconductor substrate and the deep well and a second p-n junction formed between the deep well and the first well. The p-n junction enables the voltage of input and output terminals, maintained at a specific value in most cases, to be used as power for an internal circuit, and may function to protect the internal circuit from voltage that varies temporarily when external data is input.

The semiconductor device may further include an insulating layer formed over the one surface of the semiconductor substrate including at least a region in which the deep well is formed.

The insulating layer may electrically separate the first electrical contact and the semiconductor substrate.

The semiconductor device may further include a first type doped second well formed outside the region of the deep well on the one surface of the semiconductor substrate and electrically connected to data input/output terminal, and the one or more semiconductor device elements may be formed inside a region in which the deep well is formed.

In the semiconductor device according to the present invention, all CMOS devices except some devices related to input and output are located inside the deep well, and a general CMOS circuit may be freely implemented inside the deep well.

In accordance with another aspect of the present invention, there is provided a semiconductor device, including: a data storage unit configured to store first data to be transmitted to an external apparatus; a switching circuit configured to switch between the reception of power and second data transmitted from the external apparatus, and the transmission of the first data, stored in the data storage unit, to the external apparatus using a switching control signal; and a datapath control unit configured to output switching control signals corresponding to reception mode and transmission mode to the switching circuit, to process the second data received via the switching circuit using a predetermined protocol if operating mode is the reception mode, and to switch to the transmission mode, control the switching circuit, and transmit the first data to the external apparatus using the protocol if predetermined specific data is included in the processed second data; wherein the power, the second data and the first data are transmitted and received via a first electrical contact formed on one surface of the semiconductor substrate and a second electrical contact formed on another surface of the semiconductor substrate.

The data storage unit, the switching circuit, and the datapath control unit may be formed inside the region of a deep well formed from one surface of the semiconductor substrate to the inside of the semiconductor substrate.

The datapath control unit may encode the first data in time domain, and may transmit the encoded first data to the external apparatus using the protocol.

In accordance with still another aspect of the present invention, there is provided a controller for a two-terminal semiconductor device, including: a transmission and reception terminal configured to transmit, outside a two-terminal semiconductor device in which a first electrical contact and a second electrical contact are separated by a p-n junction, wherein the reception of power, the transmission of first data and the reception of second data are all performed using two terminals, that is, the first electrical contact and the second electrical contact, the power and the second data to the two-terminal semiconductor device by varying the voltage between the two terminals, and to receive the first data from the two-terminal semiconductor device using a switching control signal, included in the second data, and a predetermined protocol; wherein the first electrical contact is formed on one surface of a semiconductor substrate on which the two-terminal semiconductor device is formed; and wherein the second electrical contact is formed on another surface of the semiconductor substrate.

The controller may further include: an encoding unit configured to encode the second data in time domain, and to transmit the encoded second data to the two-terminal semiconductor device through the transmission and reception terminal; and a decoding unit configured to receive the first data from the two-terminal semiconductor device through the transmission and reception terminal, and to decode the received first data in time domain.

In this case, the second data may include a reference signal for synchronization between the controller and the two-terminal semiconductor device, and the reference signal may be included as a part of the second data according to the predetermined protocol.

In accordance with still another aspect of the present invention, there is provided a method of fabricating a semiconductor device, including: forming a second type doped deep well from one surface of a first type doped semiconductor substrate to the inside of the first type doped semiconductor substrate; forming a first type doped first well formed inside a region surrounded by the deep well in the one surface of the semiconductor substrate, and separated from the semiconductor substrate by the deep well; forming one or more semiconductor device elements inside the deep well; forming a first electrical contact on a part of the top of the first well formed in the one surface of the semiconductor substrate; and forming a second electrical contact on another surface of the semiconductor substrate.

The present invention may be implemented using a plurality of semiconductor sensors that shares the second electrical contact.

The method may further include: further forming an electrode structure for detecting chip surface material or surrounding material on the region of the deep well; and scattering or coating material, whose electrical characteristics change, for detecting the chip surface material or surrounding material after the electrode structure has been formed.

In accordance with a further aspect of the present invention, there is provided a data collection method using a plurality of semiconductor sensors, including: bringing the lower terminals of a plurality of semiconductor sensors having upper terminals and the lower terminals into contact with random locations on an electrode plate for a first electrical contact; detecting the locations of the plurality of semiconductor sensors brought into contact with the electrode plate; bringing an electrode terminal for a second electrical contact into contact with the upper electrodes of the plurality of detected semiconductor sensors; and collecting information, sensed by each of the plurality of semiconductor sensors, using the electrode plate and the electrode terminal; wherein each of the upper electrodes is formed on one surface of a semiconductor substrate in which each of the plurality of semiconductor sensors is formed; and wherein each of the lower electrodes is formed on another surface of the semiconductor substrate.

Each of the plurality of semiconductor sensors may include: the first type doped semiconductor substrate; a second type doped deep well configured such that one or more semiconductor device elements are formed therein, and formed from the one surface of the semiconductor substrate to the inside of the semiconductor substrate; the upper terminal formed on a part of the one surface of the semiconductor substrate, and formed above the deep well; and the lower terminal formed on the other surface of the semiconductor substrate.

The detecting locations of the plurality of semiconductor sensors may include: photographing images of the plurality of semiconductor sensors brought into contact with the electrode plate; and detecting the locations of the plurality of semiconductor sensors using the image processing of the photographed images.

The bringing an electrode terminal into contact with the upper electrodes of the plurality of detected semiconductor sensors may include sequentially connecting a single reader having a probe terminal to the second electrical contacts of the respective semiconductor sensors at the detected locations for the plurality of semiconductor sensors, or simultaneously bringing a number of electrode terminals equal to the predetermined number of semiconductor sensors into contact with the upper electrodes (first electrical contacts) of the respective semiconductor sensors.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE DISCLOSURE

Embodiments of the present invention will be described in detail with reference to the accompanying drawings. In the following description of the present invention, detailed descriptions of related well-known components or functions that may unnecessarily make the gist of the present invention obscure will be omitted.

The prevent invention is not limited to the embodiments. Throughout the accompanying drawings, the same reference symbols are assigned to the same components.

A semiconductor device and a method of fabricating the same according to embodiments of the present invention are described in detail below with reference to FIGS. 1 to 14.

Currently, most CMOS devices for sensors require connections via pads, which are obtained by wire bonding or ball bonding, in order to electrically connect an internal circuit to an external system. However, in the case of small-sized sensors, a bonding structure makes a system itself complicated and increases the actual size of a chip, and thus significant problems are caused to low-cost sensors. In particular, in the case of gas or bio sensors, nano-material or chemically processed portions present on the surfaces of the sensors have the strong possibility of being damaged during a bonding process or a system formation process, and thus a problem arises in that it is difficult to achieve desirable sensing characteristics.

According to the present invention, system connections can be achieved by connections on the front and back surfaces of a semiconductor device, rather than bonding type connections based on the formation of pads, and power is supplied and also data is transmitted and received using two terminals on the front and back surfaces, and thus the semiconductor of the present invention is superior to existing products in terms of product characteristics, a fabricating process, system reliability, convenience, and cost competitiveness.

Figure 1:
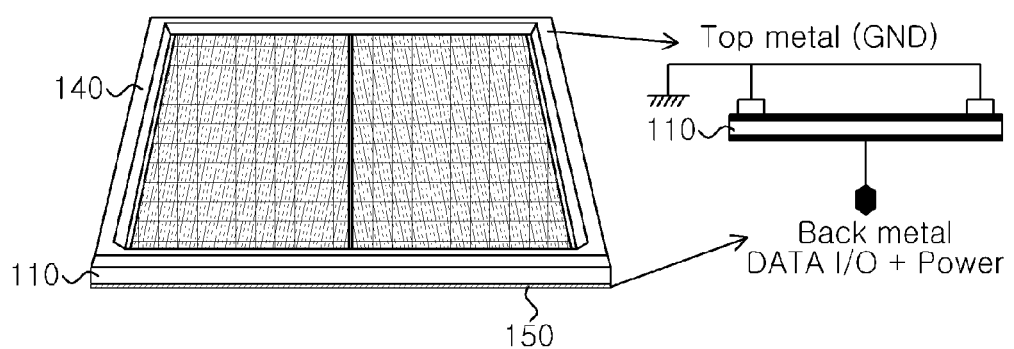
FIG. 1 shows conceptual perspective and sectional views of a semiconductor device according an embodiment of the present invention.

FIG. 1 shows conceptual perspective and sectional views of a semiconductor device according an embodiment of the present invention.

As shown in FIG. 1, the semiconductor device according to the present embodiment includes two contact terminals, i.e., a first electrical contact (top metal) 140 and a second electrical contact (back metal/bottom metal) 150, on the top and bottom surfaces of a semiconductor substrate 110, respectively.

In this case, one terminal, i.e., the first electrical contact 140, of the semiconductor device may come into contact with a metal electrode on the front surface of the semiconductor device, and the other terminal, i.e., the second electrical contact 150, may be connected to a metal electrode formed on the back surface of a chip via a backside metal process. Accordingly, the semiconductor device according to the present embodiment forms an integrated circuit (IC) without requiring pads required by conventional technology. As shown in FIG. 1, the first electrical contact 140 may be additionally implemented on the edge of the chip by a separate metal process to achieve selective electrical contact.

The semiconductor device of FIG. 1 may be implemented to use the first electrical contact 140 as a ground (GND) terminal, or to use the second electrical contact 150 as a ground (GND) terminal. When the first electrical contact 140 is used as the ground (GND) terminal, the semiconductor device may be formed on a p-type semiconductor substrate or on an n-type semiconductor substrate. Meanwhile, when the second electrical contact 150 is used as the ground (GND) terminal, the semiconductor device may also be formed on a p-type semiconductor substrate or on an n-type semiconductor substrate.

In this case, in the case of the semiconductor device in which the first electrical contact is used as a ground (GND) and the semiconductor device is formed on a p-type semiconductor substrate, the first electrical contact 140 may become the ground (GND) terminal, and the second electrical contact 150 may become a terminal for the input of (+) power VDD and the input and output of (+) data.

Furthermore, in the case of the semiconductor device in which the first electrical contact is used as a ground (GND) terminal and the semiconductor device is formed on an n-type semiconductor substrate, the first electrical contact 140 may become the ground (GND) terminal, and the second electrical contact 150 may become a terminal for the input of (−) power −VDD and the input and output of (−) data.

In the case of a semiconductor device according to another embodiment of the present invention in which a second electrical contact 150 is used as a ground (GND) terminal and the semiconductor device is formed on a p-type semiconductor substrate, the second electrical contact 150 may become a ground (GND) terminal, and a first electrical contact 140 may become a terminal for the input of (−) power −VDD and the input and output of (−) data.

Furthermore, in the case of a semiconductor device in which a second electrical contact 150 is used as a ground (GND) terminal and the semiconductor device is formed on an n-type semiconductor substrate, the second electrical contact 150 may become a ground (GND) terminal, and the first electrical contact 140 may become a terminal for the input of (+) power VDD and the input and output of (+) data.

In this case, the input and output of (+) power and (+) data refer to the cases of having an electric potential higher than the ground (GND), and the input and output of (−) power and (−) data refer to the cases of having an electric potential lower than the ground (GND).

When the fact that the semiconductor device according to the present invention is a device having two terminals and the relative concept of voltage are taken into account, it can be seen that the case of using (−) power is substantially equivalent to the case of using (+) power in that the polarities of contact terminals are reversed. Accordingly, a description of the case of using (−) power is omitted hereinafter for ease of description.

In the semiconductor device of the present invention, the first electrical contact 140 may be a metal wire, and the second electrical contact 150 may be a metal plate coated on the bottom surface of the semiconductor device.

Figure 2:
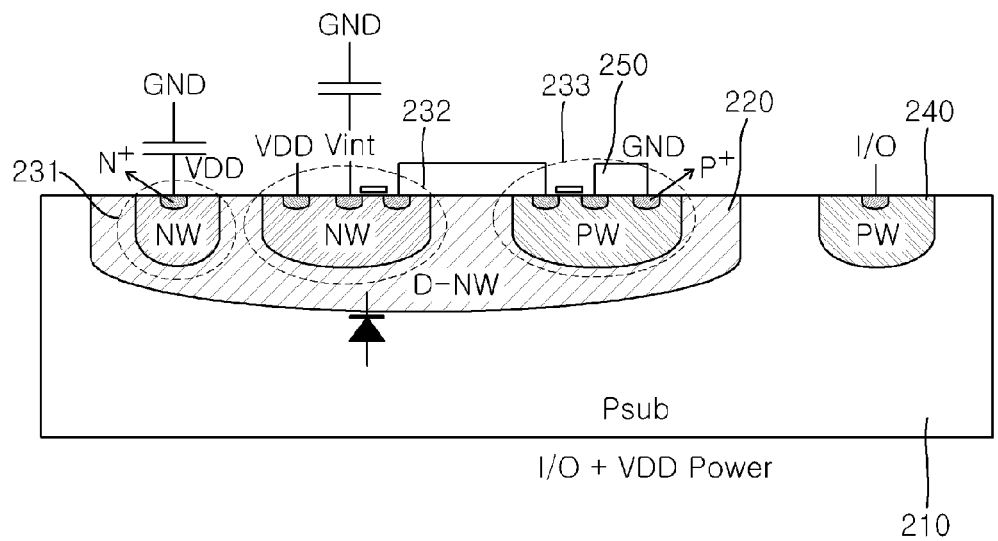
FIG. 2 is a sectional view of an embodiment of a semiconductor device formed on a p-type semiconductor substrate.
Figure 3:
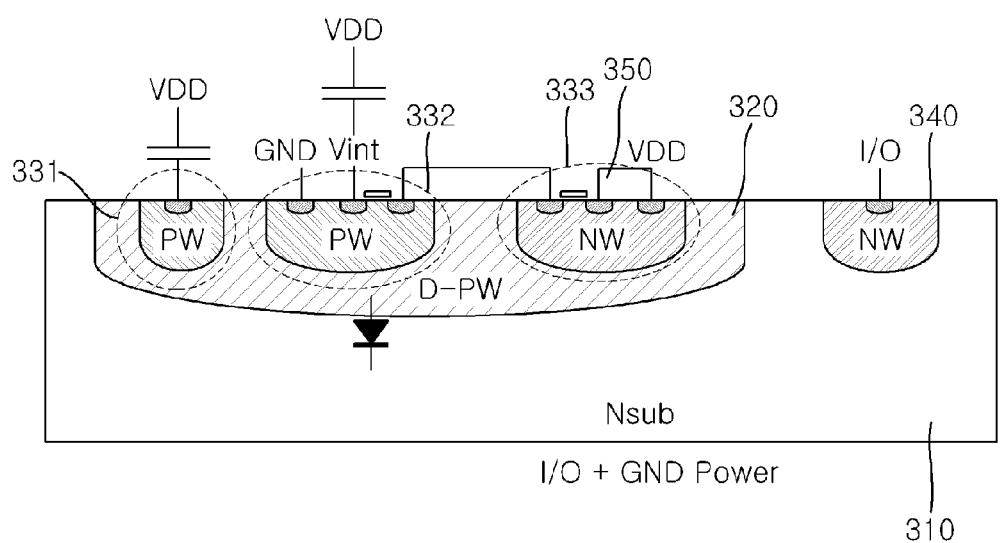
FIG. 3 is a sectional view of an embodiment of a semiconductor device formed on an n-type semiconductor substrate.

The semiconductor device according to the present invention is described using two embodiments shown in FIGS. 2 and 3.

FIG. 2 is a sectional view of an embodiment of a semiconductor device formed on a p-type semiconductor substrate. This embodiment is implemented via a CMOS process technology using a deep well.

As shown in FIG. 2, an n-type doped deep well D-NW 220 is formed from one surface of a p-type doped semiconductor substrate Psub 210 to the inside of the p-type doped semiconductor substrate Psub 210, and one or more semiconductor device elements 231 to 233 are formed inside the D-NW 220.

The deep well 220 functions to prevent any one of the p-type and n-type semiconductor device elements from being electrically connected to the semiconductor substrate 210.

In this case, the one or more semiconductor device elements 231 to 233 may be formed in an n-type doped well NW and a p-type doped well (a first PW) in the area of the D-NW 220, and the one or more semiconductor device elements 231 to 233 may include a transistor, a circuit, a poly capacitor, etc. In this case, an NMOS may be formed in the first PW surrounded by the area of the D-NW 220, and a PMOS may be formed in the NW surrounded by the area of the D-NW 220.

In this case, the one or more semiconductor device elements are located inside the area of the D-NW 220, and may be freely implemented using the deep well for substrate by means of the same method as a general CMOS device.

A second PW 240 formed outside the area of the D-NW 220 on the p-type semiconductor substrate 210 comes into electric contact with the second electrical contact 150, formed on the bottom surface of the semiconductor substrate 210, via the semiconductor substrate 210. The second PW 240 functions to connect the second electrical contact 150, i.e., a terminal for the input of power and the input and output of data, with the one or more semiconductor device elements formed inside the area of the D-NW 220. That is, a data input and output port (I/O port) provided by the semiconductor device elements formed inside the area of the D-NW 220 is electrically connected to the second PW 240, and data input and output signals (I/O signals) output by a circuit implemented by the semiconductor device elements formed inside the area of the D-NW 220 are applied to the semiconductor substrate 210 via the second PW 240. The second PW 240 is a region provides ohmic contact between the semiconductor substrate 210 and the I/O port.

The second electrical contact 150 shown in FIG. 1 may be formed in the form of a coated metal plate on the bottom surface of the p-type semiconductor substrate 210, and the second electrical contact 150 may be formed on the bottom surface of the semiconductor substrate 210 via a backside metal process.

In this case, the first electrical contact 250 of the semiconductor device formed on the p-type semiconductor substrate 210 corresponds to a part of the first electrical contact 140 shown in FIG. 1, and functions as a GND terminal. The second electrical contact 150 functions as a terminal for the input and output of data and the input of VDD power I/O+VDD Power. As shown in FIG. 2, the first electrical contact 250 is electrically connected to the first PW surrounded by the area of the DNW 220 via a P$^+$ doped region, and provides the bias of the PW. The first electrical contact 250 and the second electrical contact 150 are electrically separated by a first p-n junction formed between the semiconductor substrate 210 and the D-NW 220 and a second p-n junction formed between the D-NW 220 and the first PW. The D-NW 220 is biased to VDD, as shown in FIG. 2. A capacitor may be connected between the D-NW 220 and the first electrical contact GND 250, and may store received power.

It will be apparent that the first electrical contact 140 may be a metal wire formed in a region electrically separate from the p-type semiconductor substrate 210. The first electrical contact 140 may be formed in a region above the D-NW 220, or may be formed in a part of an electrically separate region above the p-type semiconductor substrate 210 when needed.

The first electrical contact 140 and the semiconductor substrate 210 may be electrically separated by an insulating layer (not shown) formed on one surface of the upper portion of the semiconductor substrate 210.

In this case, the insulating layer may be formed on one surface (top surface) of the semiconductor substrate 210 including a region in which the deep well 220 is formed, or may be formed on a side surface of the semiconductor substrate 210 when needed.

Furthermore, as shown in FIG. 2, the semiconductor substrate 210 is directly connected to data input and output signals, and may be used for the supply of power by means of a p-n junction diode formed between the semiconductor substrate 210 and the D-NW 220 when an input signal is high.

In the semiconductor device according to the present invention, the input and output of data and power are shared by a single terminal (the second electrical contact), as shown in FIG. 2. This terminal has a rectifier-like structure that can prevent the supply of power from being blocked even when the input of data becomes low by means of the p-n junction diode using the D-NW. Furthermore, a large capacitor may be connected to the output of the rectifier, may be used as primary power VDD, and may generate secondary power Vint whose power voltage is regulated to a somewhat low value to provide more stable power. The primary power may be selected and used when sensitivity to power noise is low and speed is required, and the secondary power may be selected and used in the case of an analog signal that is sensitive to power noise.

In this case, the data that is stored in the semiconductor device is based on a concept including not only binary data but also information present before being processed into binary data. For example, when the semiconductor device is a biosensor, it may be considered that the state in which the electrical characteristics of a bio-sensing unit adapted to sense external material have been changed by interaction with external material is maintained in the biosensor and the state is stored as information detected by the bio-sensing unit.

Furthermore, the semiconductor device according to the present invention may include a poly capacitor using a transistor, a capacitor between a conductor present inside the deep well and the ground (GND), i.e., a metal capacitor using a wiring process, and a deep well capacitor, i.e., a capacitor based on a p-n junction formed between the semiconductor substrate and the deep well.

In this case, in the semiconductor device, the drooping of power input to the semiconductor device may occur due to the deep well capacitor formed in the p-n junction region of the deep well.

It will be apparent that this drooping phenomenon may be appropriately adjusted by adjusting the size of the capacitor inside the deep well.

Figure 6:
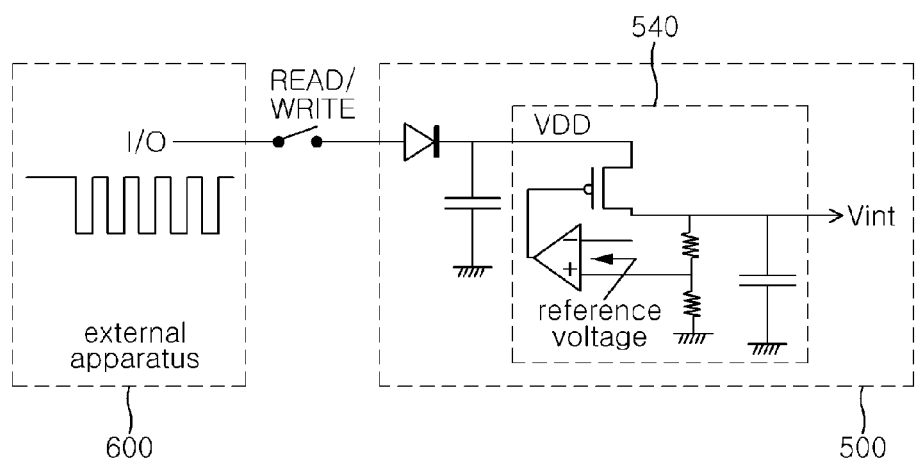
FIG. 6 is a circuit diagram showing the concept of a method of supplying power using the input and output signals of the semiconductor device of FIG. 2.

An example of a method of receiving power via a single terminal by which power and input and output data are shared is shown in FIG. 6. As shown in FIG. 6, the semiconductor device according to the present invention receives power VDD from an external apparatus 600 via the terminal for power and data input and output, i.e., the second electrical contact, input power VDD is input to the region of the D-NW via the semiconductor substrate and the p-n junction diode of the D-NW, and the power input to the region of the D-NW forms secondary power Vint, which may be used for data output or other circuitry, by means of a voltage down circuit 540 formed in the region of the D-NW.

As described above, the semiconductor device according to the present invention shares power and data input and output using the single terminal, may include the voltage down circuit used to output data stored in the semiconductor device when needed, and does not need to configure separate pads. Accordingly, the size of the semiconductor device can be minimized, and also the number of fabricating processes can be reduced, thereby reducing fabricating costs.

FIG. 3 is a sectional view of an embodiment of a semiconductor device formed on an n-type semiconductor substrate.

As shown in FIG. 3, in the semiconductor device formed on the n-type semiconductor substrate, a p-type doped deep well D-PW 320 is formed from one surface of an n-type semiconductor substrate Nsub 310 to the inside of the n-type semiconductor substrate Nsub 310, and one or more semiconductor device elements 331 to 333 are formed inside the D-PW 320.

In this case, the one or more semiconductor device elements 331 to 333 may be formed in a p-type doped well PW and an n-type doped well (a first NW) in the area of the D-PW 320, and the one or more semiconductor device elements 331 to 333 may include a transistor, a circuit, a poly capacitor, etc. In this case, a PMOS may be formed in a first NW surrounded by the area of the D-PW 320, and an NMOS may be formed in a PW surrounded by the area of the D-PW 230.

In this case, the semiconductor device elements are formed inside the area of the D-PW 320, and may be freely implemented using the deep well for substrate by means of the same method as a general CMOS device.

A second NW 340 formed outside the area of the D-PW 320 on the n-type semiconductor substrate 310 comes into electric contact with the second electrical contact 150, formed on the bottom surface of the semiconductor substrate 310, via the semiconductor substrate 310. The second NW 340 functions to connect the second electrical contact 150, i.e., a terminal for GND power and data input and output, with one or more semiconductor device elements formed inside the area of the D-PW 320. That is, a data input and output port (I/O port) provided by the semiconductor device elements formed inside the area of the D-PW 320 is electrically connected to the second NW 340, and data input and output signals (I/O signals) output by a circuit implemented by the semiconductor device elements formed inside the area of the D-PW 320 are applied to the semiconductor substrate 310 via the second NW 340. The second NW 340 is a region that provides an ohmic contact between the semiconductor substrate 310 and the I/O port.

A first electrical contact 350 of the semiconductor device formed on the n-type semiconductor substrate 310 shown in FIG. 3 may be a modification of the first electrical contact 140 shown in FIG. 1. The first electrical contact 350 functions as a terminal for the input of VDD power, and the second electrical contact 150 functions as a terminal for the input and output of data and the input of GND power I/O+GND Power. As shown in FIG. 3, the first electrical contact 350 is electrically connected to the first NW, and provides the bias of the first NW. The first electrical contact 350 and the second electrical contact 150 are electrically separated by a third p-n junction formed between the semiconductor substrate 310 and the D-PW 320 and a fourth p-n junction formed between the D-PW 320 and the first NW. The D-PW 320 is biased to GND, as shown in FIG. 3. A capacitor may be connected between the D-PW 320 and the first electrical contact VDD 350, and may store received power.

It will be apparent that the first electrical contact 140 may be a metal wire in a region electrically separate from the n-type semiconductor substrate 310. The first electrical contact 140 may be formed in a region above the D-PW 320, or may be formed on a part of an electrically separate region above the n-type semiconductor substrate 210 when needed.

The first electrical contact 140 and the semiconductor substrate 310 may be electrically separated by an insulating layer (not shown) formed on one surface of the upper portion of the semiconductor substrate 310.

In the structure of FIG. 3, a p-n junction diode is formed between the D-PW 320 and the semiconductor substrate 310, unlike in that of FIG. 2, and thus the input of power and the input and output of data are enabled via the first electrical contact 140 and the second electrical contact 150 formed on the top and bottom surfaces of the semiconductor substrate 310.

That is, as shown in FIG. 3, the semiconductor substrate 310 may be also used for the supply of power by means of the p-n junction diode formed between the D-PW 320 and the semiconductor substrate 310 when an input signal is low.

Furthermore, the semiconductor device shown in FIG. 3 may include all the functions and operations described in conjunction with FIG. 2.

As described above, the semiconductor device according to the present invention can supply power and provide input and output terminals via only two electrode connections on the top and bottom surfaces of the semiconductor substrate without requiring pads by using the deep well process of a CMOS process, and can provide a semiconductor device without pads. Accordingly, the size of the semiconductor device can be minimized, and also the number of fabricating processes can be reduced, thereby reducing fabricating costs.

Furthermore, a two-terminal semiconductor device without pads can be manufactured, so that a fabricating process can be simplified and connections to an external system can be minimized, thus being advantageous for the manufacture of a small-sized IC chip, and so that the process of performing manufacture by coating a surface with nano material in a sensor can be simplified and characteristics can be improved.

That is, the semiconductor device according to the present invention corresponds to technology that can be very usefully used in the field of sensors, and can be usefully used in the fields in which high performance is not required in terms of a circuit, power consumption is low, size is small, and connections to an external system must be reduced. In particular, the present invention can be easily applied to disposable sensors to which cost competitiveness is important and sensors to which simple electrode connections without a pad process is advantageous in terms of a structure, for example, sensors in which nano-material is applied to all surfaces, and thus the present invention can be utilized in the environmental industry using gas sensors, the medical equipment industry requiring the diagnosis of diseases, and the pharmaceutical industry (for example, the new medicine development industry requiring the possibility tests of new medicines).

Figure 4:
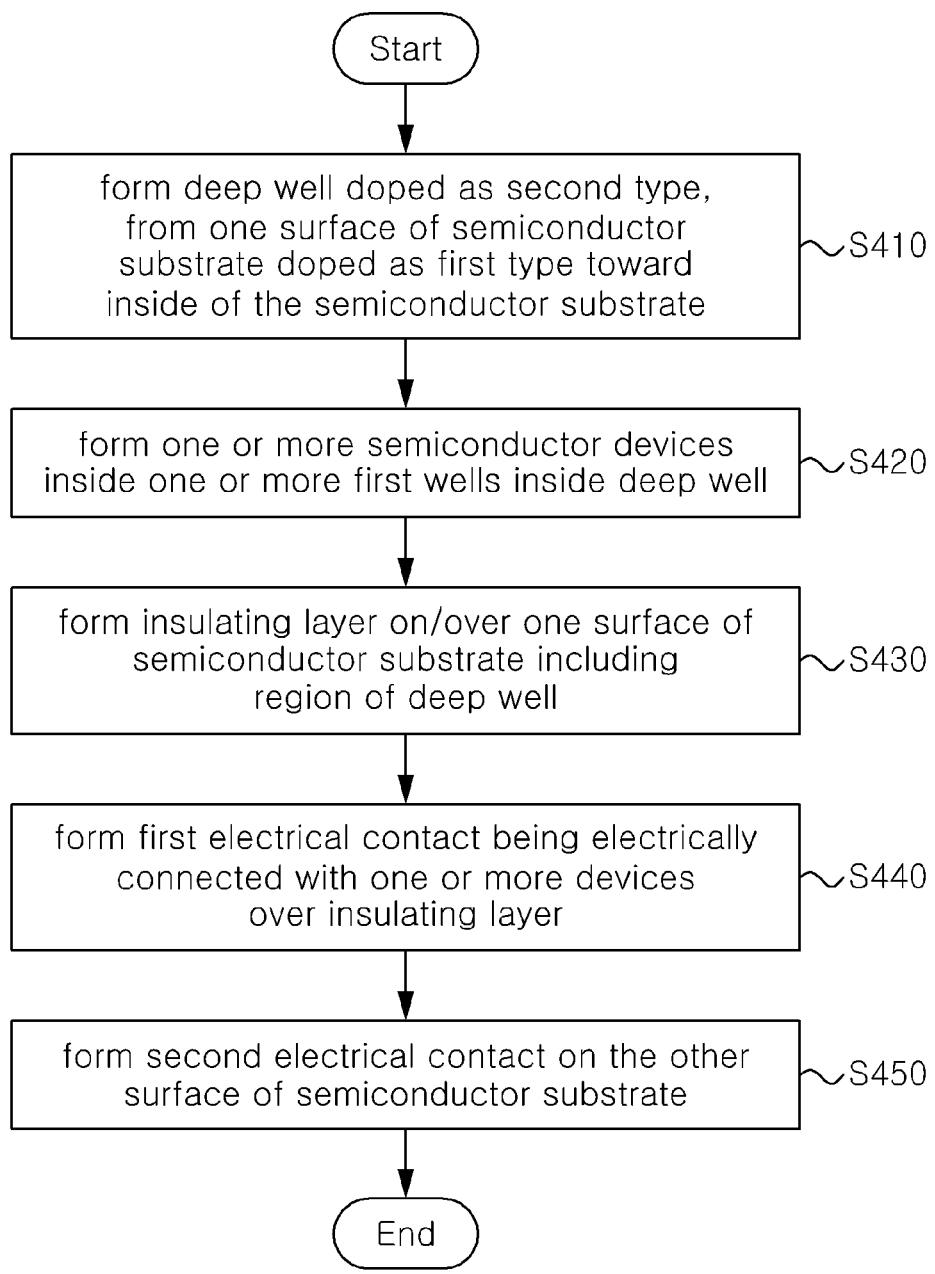
FIG. 4 is an operation flowchart of a method of fabricating a semiconductor device according to an embodiment of the present invention.

FIG. 4 is an operation flowchart of a method of fabricating a semiconductor device according to an embodiment of the present invention. This drawing shows the process of fabricating the semiconductor devices according to the present invention, which are shown in FIGS. 1 to 3.

Referring to FIG. 4, in the method of fabricating a semiconductor device according to the present embodiment, a second-type, for example, n-type doped deep well D-NW is formed from one surface of a first type, for example, p-type, doped semiconductor substrate to the inside of the semiconductor substrate at step S410, and one or more semiconductor device elements are formed inside the formed D-NW at step S420.

In this case, the one or more semiconductor device elements may include all the plurality of semiconductor device elements of a general CMOS circuit using a deep well for semiconductor substrate, such as a transistor, a poly capacitor, a metal capacitor using a wiring process, and a resistor.

Once the one or more semiconductor device elements have been formed, an insulating layer is formed on one surface of the semiconductor substrate in which the deep well has been formed at step S430.

In this case, the insulating layer is formed to provide electrical separation between the first electrical contact of the two terminals of the semiconductor device and the semiconductor substrate. The insulating layer may be formed in an area including the area of the deep well, and may be formed on a side surface of the semiconductor substrate when needed.

Once the insulating layer has been formed, a first electrical contact configured to electrically connect with the one or more semiconductor device elements is formed on the insulating layer at step S440, and a second electrical contact is formed on another surface of the semiconductor substrate at step S450.

In this case, the first electrical contact and the second electrical contact are two terminals for the power input and data input and output of the semiconductor device, and the power input and the data input and output may be shared by a single terminal.

The first electrical contact may be a metal wire, and the second electrical contact may be a metal plate coated on the bottom surface of the semiconductor device.

In this case, the semiconductor device according to the embodiment of the present invention may be applied to various types of sensing applications, such as chemical sensors, biosensors, humidity sensors, gas sensors, etc. Generally, there are many cases where chemical sensors, biosensors, etc. are implemented using a method in which a receptor attached to electrically conductive material (whose characteristics may be changed into those of an non-conductor, a semiconductor or a conductor depending on the concentration of dopant), such as carbon nano-tubes (CNTs) or silicon nano-wire SiNW, reacts with surrounding chemical material and senses a change in electrical conductivity occurring in the material as a result.

In the method of fabricating a semiconductor device according to the present invention, after the first electrical contact and the second electrical contact have been formed, a material for sensing chip surface material, such as carbon nano-tubes, may be coated, dispersed, applied, or stacked onto a chip surface.

The first electrical contact is implemented along the edge of the chip in the form of a guard ring, as shown in FIG. 1, and electrode structures configured to connect with the carbon nano-tubes may be further included inside the first electrical contact, i.e., a surface of the chip. These electrode structures and the semiconductor device elements (circuits) connected to the electrode structures are located inside the deep well. When the carbon nano-tubes are coated, dispersed, applied, or stacked later, they may be used to sense chip surface material or material surrounding an environment in which the chip is disposed.

In this case, the electrode structures configured to sense the chip surface material or surrounding material may be implemented in a predetermined form of metal wire. The electrode structures may be implemented so as to be exposed in a specific pattern in preparation for the time at which a material, such as carbon nano-tubes, is applied. That is, when a material, such as carbon nano-tubes, is applied, the electrode structures may be appropriately exposed as terminals at both distal ends, which are used to form a type of resistors.

Furthermore, in the case where it is desirable that the exposed electrode structures are not electrically connected to each other even when a material, such as carbon nano-tubes, is applied, the electrical connection may be prevented, for example, by forming an electrical insulator with a high barrier.

In the method of fabricating a semiconductor device according to the present invention, after an overall high-temperature semiconductor process (including a metallization process) has been terminated, an electrically conductive material for sensing chip surface material or surrounding material, such as carbon nano-tubes, is coated, dispersed, applied, or stacked, and thus the effect of not changing the characteristics of the electrically conductive material, such as carbon nano-tubes, may be achieved. Meanwhile, in an embodiment of the present invention, a material for sensing chip surface material or surrounding material is not limited to an electrically conductive material, but may include all materials whose electrical characteristics change in response to a change in the concentration or state of chip surface material or surrounding material, such as a material capable of capacitive sensing.

According to the conventional technology, a plurality of terminals must be exposed in the form of pads in order to read the sensing data of a chip, and thus a metallization process, a passivation process and a wire bonding process must be undergone to form pads after an electrically conductive material, such as carbon nano-tubes, has been coated. In this case, since the electrically conductive material is exposed to the high-temperature semiconductor process, the characteristics of the electrically conductive material, such as carbon nano-tubes, change randomly, and thus a problem arises in that the reliability of a sensor is degraded.

The present invention proposes the new structure of a semiconductor device, and thus it is not necessary to undergo the process of forming pads, with the result that the characteristics of an electrically conductive material, such as carbon nano-tubes, can be maintained without change, thereby achieving an advantage in which the reliability of a sensor can be considerably increased.

It should be appreciated that the method of fabricating a semiconductor device according to the present invention is not limited to the above description, but may include all the processes of fabricating the structures of the semiconductor devices described in conjunction with FIGS. 1 to 3.

Figure 5:
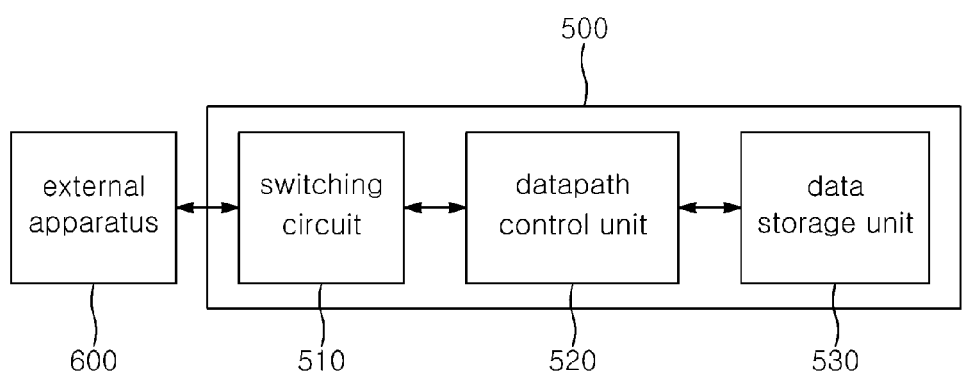
FIG. 5 shows the configuration of a semiconductor device according to an embodiment of the present invention.

FIG. 5 shows the configuration of a semiconductor device 500 according to an embodiment of the present invention.

Referring to FIG. 5, the semiconductor device 500 according to the present embodiment includes a switching circuit 510, a datapath control unit 520, and a data storage unit 530.

The data storage unit 530 stores first data to be transmitted to the external apparatus 600.

In this case, the first data stored in the data storage unit 530 not only refers to binary data, but may also include information present before being processed into binary data. For example, when the semiconductor device is a biosensor, it may be considered that the state in which the electrical characteristics of a bio-sensing unit adapted to sense external material have been changed by interaction with external material is maintained in the biosensor and the data storage unit 530 stores the state as information detected by the bio-sensing unit.

It will be apparent that the data storage unit 530 is not limited to the storage of the first data, but may store information about instructions received from the external apparatus 600 and also store various types of information related to the present invention.

The switching circuit 510 switches between the reception of power and second data transmitted from the external apparatus 600 and the transmission of the first data, stored in the data storage unit 530, to the external apparatus 600 through control based on a switching control signal.

In this case, the second data may include all data related to writing to the semiconductor device, such as data adapted for writing to the semiconductor device 500 and instruction data to be transferred to the semiconductor device 500.

The switching circuit 510 is connected to an external apparatus via a single terminal, and the reception of power and second data and the transmission of first data may be performed via the single connected terminal.

This switching circuit 510 may include a tri-state switch, and may operate in transmission mode and reception mode without an interruption state.

The datapath control unit 520 is a configuration that controls the reception of power and second data and the transmission of first data. The datapath control unit 520 outputs switching control signals corresponding to reception mode (write mode) and transmission mode (read mode) to the switching circuit 510, and processes second data, received via the switching circuit 510, using a predetermined protocol in the case of reception mode.

In this case, the semiconductor device 500 may be operated using power received from the external apparatus 600, and may generate secondary power, used to stably output first data to the external apparatus 600, using additionally received power.

Furthermore, the datapath control unit 520 examines second data received via reception mode, controls the switching circuit 510 to switch from reception mode to transmission mode if, as a result of the examination, predetermined specific data is included in the second data, and transmits first data, stored in the data storage unit 530, to the external apparatus 600 via the switching circuit 510 using a protocol after switching to the transmission mode.

It will be apparent that the datapath control unit 520 controls the switching circuit 510 so that the semiconductor device basically operates in reception mode. The datapath control unit 520 controls the switching circuit 510 only if specific data for switching to transmission mode is included in the second data received via reception mode, and thus the semiconductor device is switched to transmission mode and transmits first data, for example, information attributable to sensing, stored in data storage unit 530, to the external apparatus 600. Furthermore, although an operation may vary according to content predetermined in the protocol, the mode may be automatically returned to reception mode, i.e., basic mode, after transmission mode for a predetermined time interval has been terminated.

The above-described switching circuit 510, data storage unit 530 and datapath control unit 520 may be configured using the one or more semiconductor device elements formed in the area of the deep well shown in FIGS. 1 to 3, and the semiconductor device according to the present invention may be configured based on the above-described semiconductor device elements.

Operations in the reception mode (write mode) and transmission mode (read mode) of the semiconductor device according to the present invention are described with reference to FIG. 7, as follows.

Figure 7A:
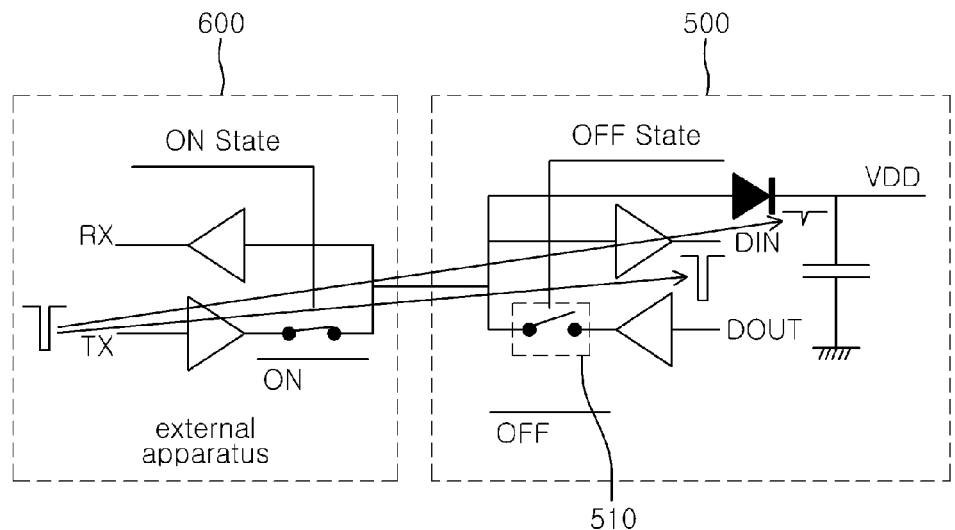
FIGS. 7A and 7B are diagrams showing examples of operations in the write and read modes of a semiconductor device, respectively.
Figure 7B:
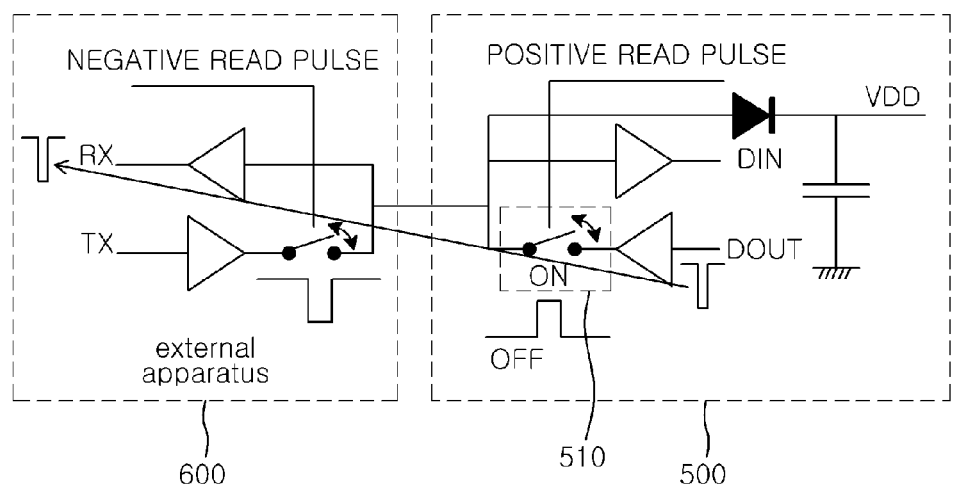

FIGS. 7A and 7B are diagrams showing examples of operations in the write and read modes of a semiconductor device, respectively.

Referring to FIG. 7A, an operation in the write mode (reception mode) of a semiconductor device 500 is now described. The semiconductor device 500 basically turns off the switching circuit 510 to operate in write mode in which power and second data are received from the external apparatus 600. By turning off the switching circuit 510, power VDD and second data DIN transmitted via the transmitter TX of the external apparatus may be received, and first data DOUT stored in the data storage unit 530 is prevented from being transmitted to the external apparatus 600.

In this case, the semiconductor device 500 receives power VDD and second data DIN via a single terminal. The power VDD may be received via a p-n junction diode formed by the semiconductor substrate and the deep well, and the second data DIN may be provided via one or more semiconductor device elements formed in an area other than the deep well.

From FIG. 7A, it can be seen that the output voltage of the diode undergoes a drooping phenomenon based on the ratio of the size of an internal capacitance formed inside the area of the deep well to the size of a deep well capacitance formed between the semiconductor substrate and the area of the deep well. This drooping phenomenon is a phenomenon in which the charges stored in the internal capacitor are shared by the p-n junction capacitor of the deep well and thus the output voltage of the diode drops, in which case a voltage drop of $C(DW)*VDD/(C(internal)+C(DW))$ occurs. Accordingly, when this ratio is minimized, the drooping phenomenon can be reduced.

Referring to FIG. 7B, an operation in the read mode (transmission mode) of a semiconductor device is now described. For the external apparatus 600 to receive the first data stored in the semiconductor device 500, predetermined specific data is transmitted to the semiconductor device 500, and the mode is switched from transmission mode to reception mode for a predetermined period after a predetermined period.

The semiconductor device 500 determines whether specific data has been received through the determination of second data received from the external apparatus 600, and turns on the switching circuit 510 for a predetermined period to switch the mode of the semiconductor device 500 to transmission mode after the specific data has been received and then a predetermined period has elapsed. Accordingly, the first data DOUT stored in the data storage unit 530 is transmitted to the external apparatus 600 via a single terminal, and thus the receiver RX of the external apparatus 600 receives the first data transmitted from the semiconductor device 500 for a predetermined period.

In this case, the semiconductor device 500 may transmit the first data to the external apparatus 600 using secondary power generated using power received from the external apparatus 600.

The semiconductor device according to the present invention may receive power and second data from an external apparatus via a single terminal, may transmit first data to the external apparatus, and may examine the second data, received from the external apparatus, using a predetermined protocol, through which reception mode (write mode) and transmission mode (read mode) may be controlled by the semiconductor device itself.

Furthermore, the semiconductor device according to the present invention may apply a different transmission method in accordance with the size of data to be transmitted, which is described with reference to FIGS. 8 and 9, as follows.

Figure 8:
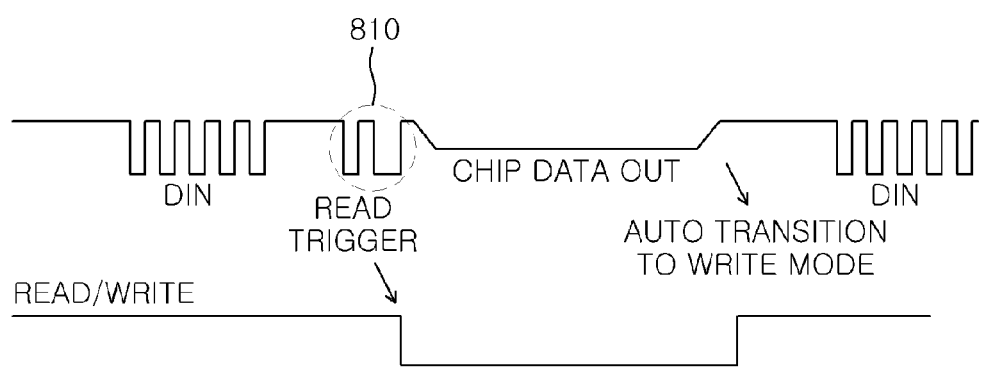
FIG. 8 is a timing chart showing an embodiment for reading a small amount of chip data.

The semiconductor device receives power and second data DIN from the external apparatus, checks the size of first data (chip data) to be transmitted if specific data (read trigger) 810 preset for switching to transmission mode has been received from the external apparatus, and, if, as a result of the checking, the size of the first data is equal to or smaller than a predetermined reference size, transmits the first data, stored in the data storage unit, to the external apparatus at one time for a predetermined period, as shown in FIG. 8, and then is automatically switched to write mode.

Figure 9:
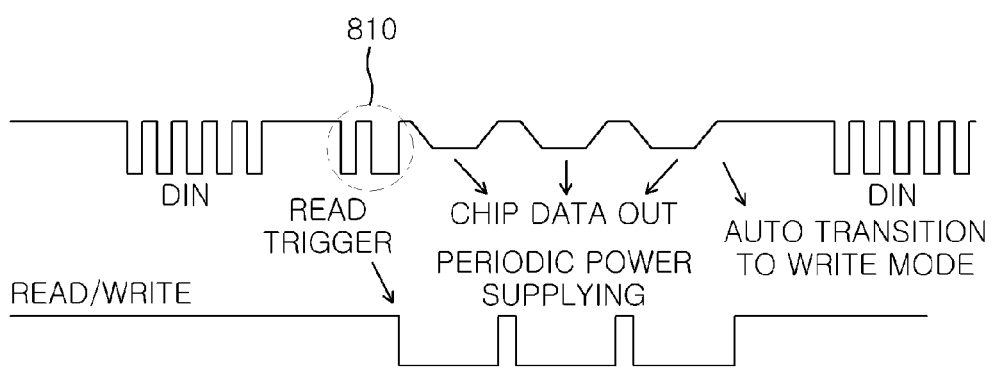
FIG. 9 is a timing chart showing an embodiment for reading a large amount of chip data.

In contrast, if the size of first data is larger than the predetermined reference size when the semiconductor device receives specific data (read trigger) 810 and checks the size of the first data, the semiconductor device repeats the process of transmitting part of the first data for a predetermined period, for example, a first period and then switching to reception mode for a predetermined period, for example, a second period, until all the first data is transmitted, as shown in FIG. 9, and is automatically switched to write mode when all the first data stored in the data storage unit has been transmitted.

In this case, the reason for switching between transmission mode and reception mode if the size of the first data is larger than the reference size is to switch to reception mode during the transmission of the first data and periodically receive power from the external apparatus because the amount of power available from the semiconductor device itself is small.

As described above, the semiconductor device according to the present invention may apply a different transmission method in accordance with the size of data to be transmitted to the external apparatus. Furthermore, the semiconductor device according to the present invention may use encoded data in order to reduce the amount of power to be used, which is described with reference to FIGS. 10 and 11.

Figure 10:
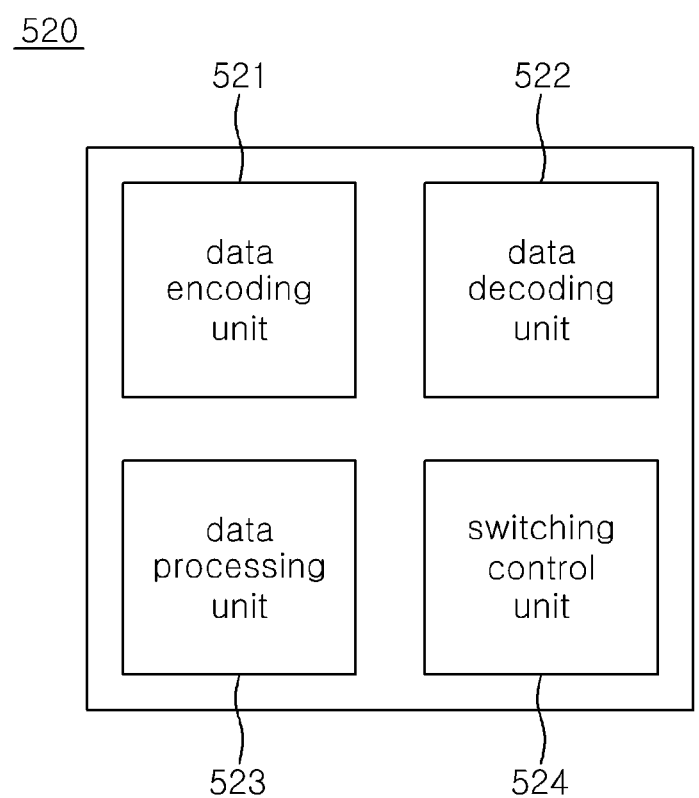
FIG. 10 shows the configuration of an embodiment of the datapath control unit shown in FIG. 5.

FIG. 10 shows the configuration of an embodiment of the datapath control unit shown in FIG. 5.

Referring to FIG. 10, the datapath control unit 520 includes an RX data encoding unit 521, a TX data decoding unit 522, a data processing unit 523, and a switching control unit 524.

The RX data encoding unit 521 encodes data to be transmitted to the external apparatus 600 using a predetermined encoding method in time domain.

Figure 11:
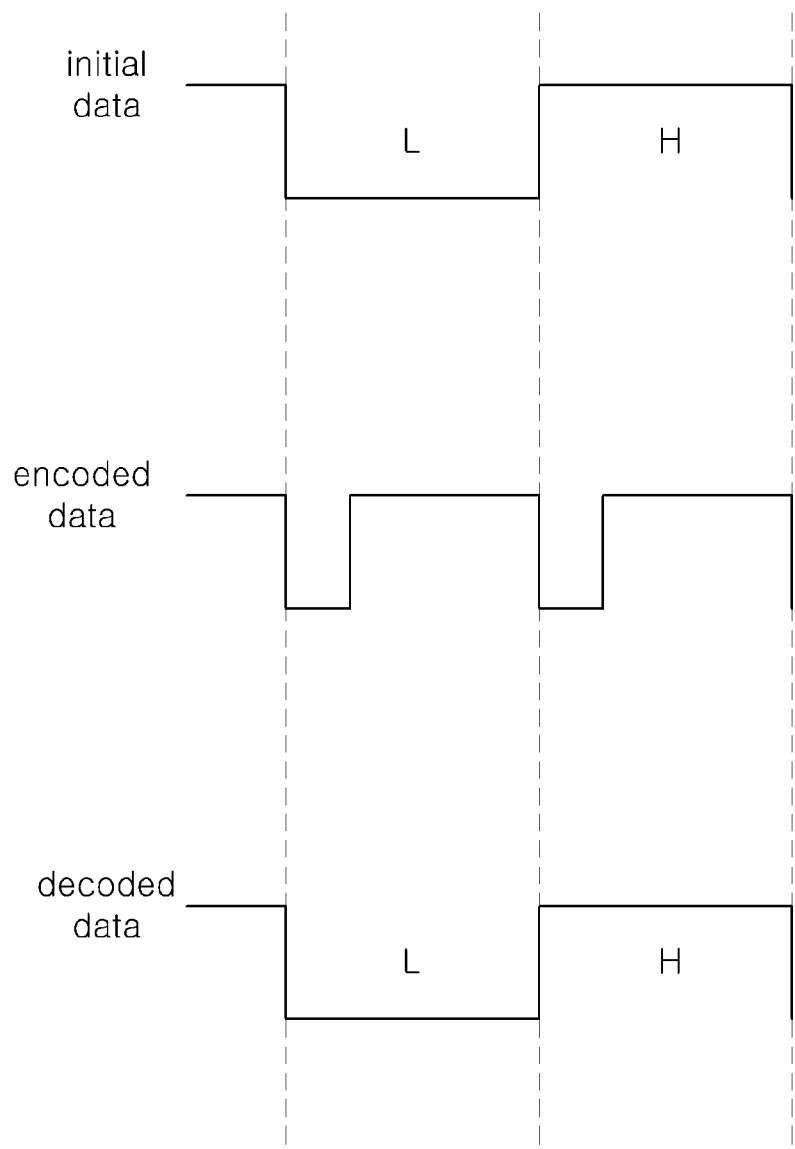
FIG. 11 is a diagram showing an example of encoding data, received at a semiconductor device, in time domain.

For example, the RX data encoding unit 521 may encode first data (initial data) to be transmitted to the outside, as in the example shown in FIG. 11. The RX data encoding unit 521 performs encoding in time domain, which generates a low pulse for a predetermined period, at the times at which the trigger of the initial data is generated, i.e., a falling edge at which a signal level falls from H (high) to L (low) and a rising edge at which a signal level rises from L to H, thereby reducing the size of a low signal interval.

In this case, the semiconductor device of the present invention basically receives both power and a signal via the two limited terminals (a single port), and transmission data is also transmitted via the same port. During transmission and reception to and from the external apparatus 600, it is necessary to reduce a logical low signal interval, i.e., an interval for data different from power. That is, since a high signal interval may be considered to be an interval during which data identical to power is transmitted and received but a low signal interval is an interval for data different from power, a technique for appropriately reducing a low signal interval is required for the stable operation of the semiconductor device.

In this case, the logical low level refers to a level different from that of power voltage on data input and output lines. The logical low level refers to a GND level in the case where a deep n-well is used as in FIG. 2, and refers to a VDD level because a GND level is used as source power in the case where a deep p-well is used as in FIG. 3.

Meanwhile, this signal encoding/decoding technique may reduce power consumption inside the semiconductor device 500. More specifically, since the semiconductor device of the present invention stores and uses power, received via a single port, in a relatively large capacitor or the like, the loss of electrical charges stored in the semiconductor device is proportional to the proportion of signals having a logical low level included in input and output signals.

Accordingly, the semiconductor device of the present invention is intended to reduce the proportion of signals having a logical low level during data input and output processes in such a way as to transmit data in an encoded state and to decode and use encoded signal, received from the outside, inside a chip in time domain, as shown in FIGS. 10 and 11.

An example of the data encoding process performed in the RX data encoding unit 521 of the present invention may be performed, as shown in FIG. 11, or may be performed using one of various well-known methods. In particular, a circuit for generating short pulses at a rising edge and a falling edge itself, described in conjunction with FIG. 11, corresponds to well-known technology, and is apparent to those skilled in the art. The spirit of the present invention does not reside in the implementation of such a circuit for generating pulse signals, but resides in the proposal of a signal processing protocol and algorithm for performing encoding in time domain using such a circuit, thereby reducing the loss of charges inside the semiconductor device.

Although not shown in FIG. 11 in detail, the semiconductor device of the present invention may internally generate and drive separate clock signals, the semiconductor device may recognize input signals as data in synchronization with such clock signals (this function may be additionally performed in the switching circuit 510 and the datapath control unit 520 described above).

In this case, for example, a low level signal may be maintained over four clocks, and a total of four pieces of low data may be recognized over four clocks. In this case, inside the semiconductor device, all charges stored in the semiconductor device may be consumed in order to process the four pieces of low data. Accordingly, the present invention is intended to reduce a period during which a low level signal is maintained during the input and output of data in such a way as to generate an encoded signal by performing encoding in time domain and transfer the encoded signal to the data output unit, rather than transferring and processing the four pieces of low data without change.

For example, when a low level signal is maintained over four clocks and then transitions to a high level signal during a subsequent clock, the encoded signal appears as a first short pulse signal at the time at which a low level signal is generated first, and appears as a second short pulse signal at the time at which the low level signal transitions to the high level signal. In this case, since the level of a signal falls to a low level only in an interval during which two short pulse signals are generated, the time interval during which a signal is maintained at a low level can be reduced inside the semiconductor device, and charges stored in the semiconductor device can be advantageously preserved.

Figure 13:
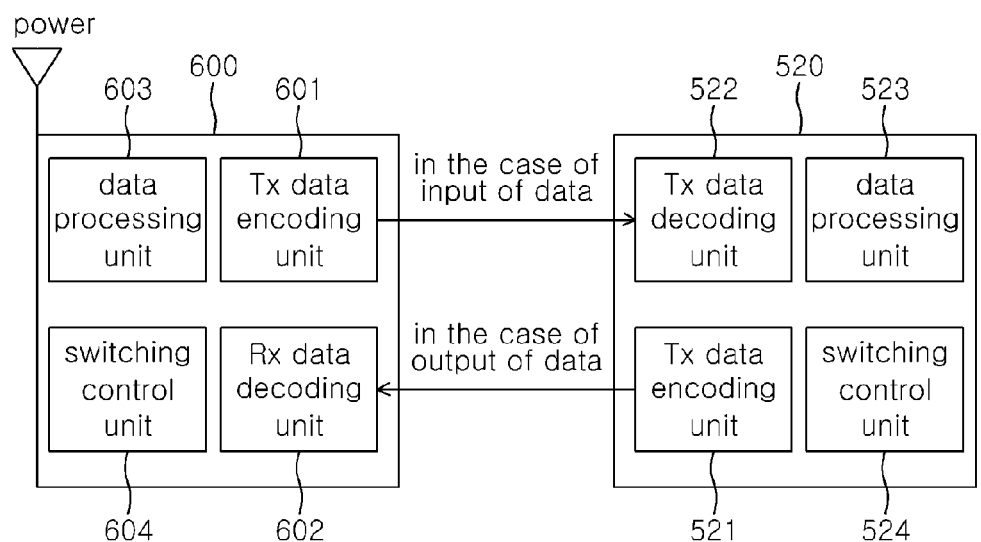
FIG. 13 shows a process of data transmission and reception between an external apparatus and a semiconductor device according to an embodiment of the present invention.

FIG. 13 shows a process of data transmission and reception between an external apparatus 600 and a semiconductor device 500 according to an embodiment of the present invention.

Referring to FIGS. 10, 11 and 13 together, signal encoding and decoding that are performed in the process of data transmission and reception between the external apparatus 600 and the semiconductor device 500 are described below.

In FIG. 11, initial data may be first data that is transmitted by the semiconductor device 500, or second data that the semiconductor device 500 desires to receive from the outside. That is, when the initial data is the first data, an Rx data encoding unit 521 encodes initial data, and the encoded data is transmitted to the external apparatus 600 via the only port. In contrast, when the initial data is the second data, a Tx data encoding unit 601 encodes the initial data, and the encoded data is transmitted to the semiconductor device 500 via the only port.

In this case, Tx refers to a flow in which data is transmitted from the external apparatus 600 to the semiconductor device 500, i.e., a case where data is transmitted in write mode, and Rx refers to a flow in which data is transmitted from the semiconductor device 500 to the external apparatus 600, i.e., a case where data is transmitted in read mode.

The Rx encoded data received by the external apparatus 600 is decoded using a predetermined decoding method in time domain by an Rx data decoding unit 602, and is processed by a data processing unit 603.

The Tx encoded data received by the semiconductor device 500 is decoded using a predetermined decoding method in time domain by a Tx data decoding unit 522, and is processed by a data processing unit 523.

In this case, the data processing corresponds to a concept including all processing, such as an operation using decoded data, the detection of specific data, the detection of signals previously agreed in an protocol (including switching between read mode and write mode, the termination of an operation, etc.), etc., and also corresponds to a concept including all data processing related to the present invention.

The switching control unit 524 controls the switching of the switching circuit 510 based on the result of processing performed by the data processing unit 523. That is, the switching control unit 524 generates switching control signals in accordance with reception mode and transmission mode, and controls the switching circuit 510 using the generated switching control signals.

Meanwhile, the second data, i.e., Tx data, transmitted by the external apparatus 600 includes a reference signal for synchronization between the semiconductor device 500 and the external apparatus 600. In this case, the reference signal is included as part of the second data according to a predetermined protocol.

For example, a clock signal having a specific period for a predetermined period of time after an initial power-up sequence may be included in Tx data as the reference signal according to a previously agreed protocol, and may be transmitted from the external apparatus 600 to the semiconductor device 500. The semiconductor device 500 may generate an internal clock signal based on the clock signal received at this time, and may use the internal clock signal for the purpose of synchronization.

Alternatively, the clock signal may be transmitted for a specific time interval in order to determine whether synchronization has been desirably achieved at each specific time interval.

Meanwhile, the external apparatus 600 of the present invention may receives Rx data from the two-terminal semiconductor device 500, and may obtain the result of a task (for example, sensing) performed by the semiconductor device 500. For the semiconductor device 500 to smoothly perform a predetermined task, information according to a predetermined protocol is transferred using Tx data, and thus the external apparatus 600 may be considered to be an external controller for the two-terminal semiconductor device 500. Furthermore, the external apparatus 600 functions to read the result of a task performed by the semiconductor device 500, and thus the external apparatus 600 may be considered to be an external reader.

As described above, the semiconductor device according to the present invention is suitable for fields in which high performance is not required in terms of a circuit, power consumption is low, a size is small, and connections to an external system must be reduced. Furthermore, the semiconductor device of the present invention may be used in various small-sized sensor chips, such as product identification ID chips equipped with sensors requiring a small size and low costs.

Figure 12:
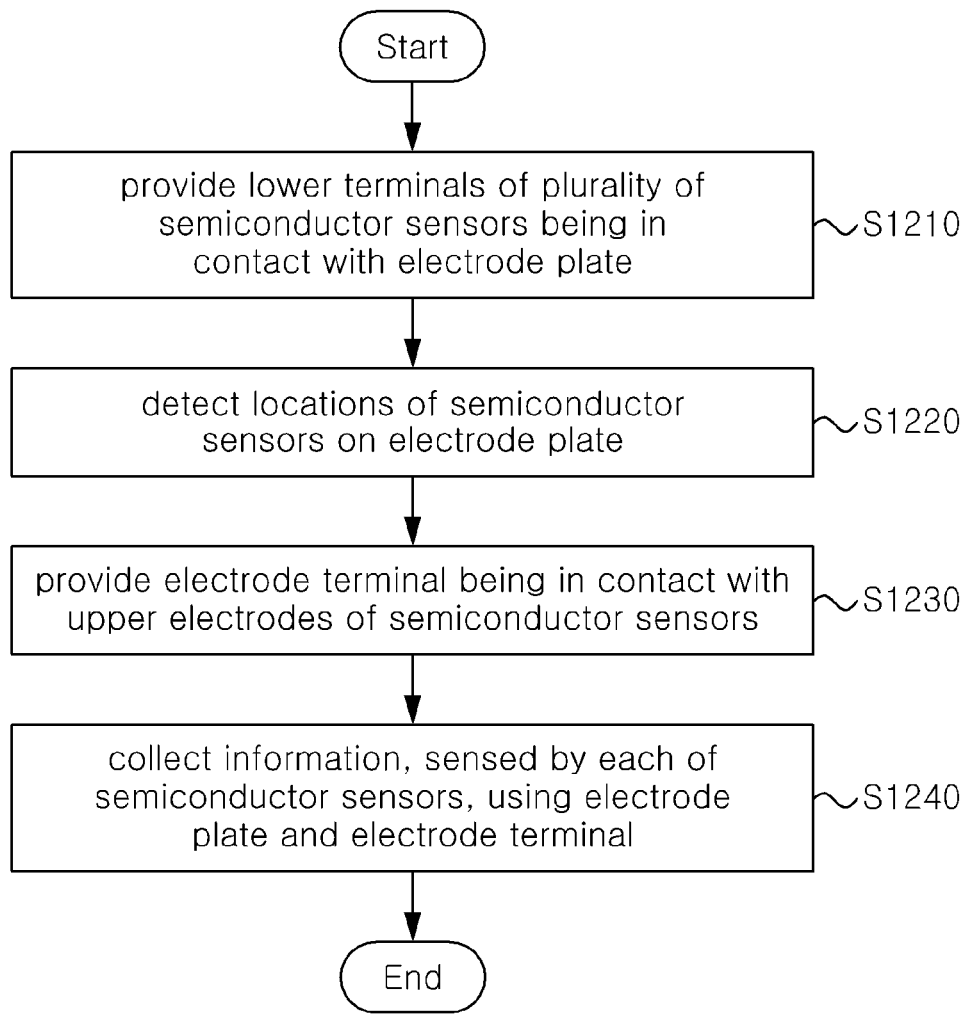
FIG. 12 is an operation flowchart showing a data collection method using semiconductor sensors according to an embodiment of the present invention.

FIG. 12 is an operation flowchart showing a data collection method using semiconductor sensors according to an embodiment of the present invention.

Referring to FIG. 12, in the data collection method using semiconductor sensors according to the present embodiment, the lower terminals of a plurality of semiconductor sensors having supper terminals and lower terminals are brought into contact with an electrode plate for a first electrical contact at step S1210.

In this case, the plurality of semiconductor sensors may be brought into contact with random locations on the electrode plate, and may be disposed at predetermined locations.

The semiconductor sensors intended to collect data may include biosensors for detecting specific material, and the electrode plate with which the semiconductor sensors are brought into contact may be made of material having conductivity and magnetism.

Furthermore, the semiconductor sensors may include the structures of the semiconductor devices shown in FIGS. 1 to 3.

That is, each of the plurality of semiconductor sensors may include: a first type doped semiconductor substrate; a second type doped deep well formed from one surface of a semiconductor substrate to the inside of the semiconductor substrate; an upper terminal formed on a part of the surface of the semiconductor substrate, and formed above the deep well; and the lower terminal formed on another surface of the semiconductor substrate.

It will be apparent that the semiconductor device elements formed in the deep well may include a sensing circuit, etc. required for the configuration of a semiconductor sensor.

The semiconductor sensors intended to collect data may be sensors introduced into a specific region, a specific environment, a specific solution or the like in order to detect specific material. For example, the semiconductor sensors have a bead shape adapted to detect specific molecules in a solution, are equipped with receptors capable of sensing specific molecules and are introduced into the solution, and thus the semiconductor device may have information about the sensing of the specific molecules.

When the plurality of semiconductor sensors is brought into contact with the electrode plate, the locations of the respective semiconductor sensors on the electrode plate are detected at step S1220.

In this case, the detection of the locations of the semiconductor sensors are performed by photographing images of the plurality of semiconductor sensors brought into contact with the electrode plate and detecting the locations of the plurality of semiconductor sensors through the image processing of the photographed images.

The detection of the locations of the semiconductor sensors may be performed using not only the method of detecting locations using images but also all methods of detecting locations.

Once the locations of the semiconductor sensors have been detected, an electrode terminal for a second electrical contact is brought into contact with upper electrodes of the semiconductor sensors whose locations have been detected at step S1230, and information sensed by each of the semiconductor sensors is detected using the electrode plate and the electrode terminal brought into contact with the semiconductor sensors and the information sensed by each of the semiconductor sensors is collected at step S1240.

In this case, at step S1230 of bringing the electrode terminal into contact with the semiconductor sensors, a single reader having a probe terminal may be sequentially connected to the second electrical contacts of the respective semiconductor sensors at the locations detected for the plurality of semiconductor sensors, or a number of electrode terminals equal to the predetermined number of semiconductor sensors may be simultaneously brought into contact with the upper electrodes (first electrical contacts) of the respective semiconductor sensors.

In a method of bringing the electrode terminals into contact with the upper electrodes, electrode terminals are arranged on an electrode plate having a size corresponding to the size of the substrate, and the substrate on which the electrode terminals have been arranged is brought into contact with the plurality of semiconductor sensors brought into contact with the electrode plate, thereby collecting the information sensed by the semiconductor sensors.

It will be apparent that the intervals at which the electrode terminals are arranged may be determined taking into account the size of the semiconductor sensors.

Figure 14:
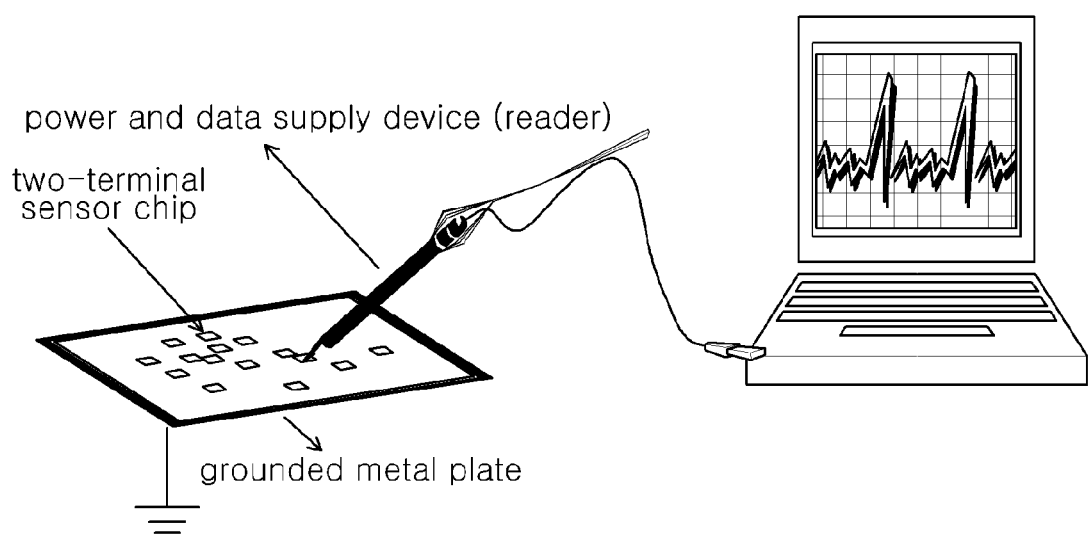
FIG. 14 is a diagram showing the concept of the data collection method using semiconductor sensors according to the embodiment of FIG. 12.

FIG. 14 is a diagram showing the concept of the data collection method using semiconductor sensors according to the embodiment of FIG. 12.

A plurality of two-terminal sensor chips is disposed on a grounded metal plate at random locations. For example, the plurality of two-terminal sensor chips may be scattered on the grounded metal plate.

In this case, the two-terminal sensor chips are implemented, as shown in FIGS. 1 to 11, and the lower electrodes of the two-terminal sensor chips include Fe. When the grounded metal plate has magnetism, the plurality of two-terminal sensor chips scattered on the grounded metal plate is fastened while bringing the lower electrodes into contact with the grounded metal plate.

In this case, an external power and data supply device (a reader or a controller) may read data from the sensor chips while sequentially coming into contact with the upper electrodes of the plurality of two-terminal sensor chips.

In this case, the locations of the two-terminal sensor chips arranged on the grounded metal plate at random locations may be determined via a device, such as a machine vision device, and an external power and data supply device (a reader or controller) may come into contact with the upper electrodes of the two-terminal sensor chips at the determined locations, supply Tx data, and read Rx data.

Although the technology in which a single external reader is present and sequentially read the sensor chips is shown in FIG. 14, the spirit of the present invention is not limited thereto, but a plurality of external readers may be present and simultaneously read data from a number of sensor chips equal to the number of readers.

The external reader may be connected to an actuation device, such as a robot arm, and may be controlled by a control system.

Through this process, a plurality of pieces of sensing data is collected from a plurality of two-terminal sensor chips, and thus the reliability of sensing information can be improved.

According to the present invention, power can be supplied to a semiconductor device and input and output terminals can be provided via only two electrode connections on front and back surfaces using the deep well process of a CMOS process without pads, and thus a semiconductor device without pads can be provided, thereby minimizing the size of the semiconductor device, and also reducing fabricating costs by reducing the number fabricating processes.

Accordingly, the fabricating process of an IC without two-terminal pads can be simplified, and connections to an external system are minimized, thereby being advantageous to the manufacture of small-sized IC chips.

Furthermore, according to the present invention, a pad process can be eliminated in the manufacture of a semiconductor device, thereby simplifying processes and also improving characteristics in connection with a sensor that is manufactured by coating surfaces with nano-material or the like.

That is, the present invention can be usefully used in a sensor field, and is suitable for the fields in which high performance is not required in terms of a circuit, power consumption is low, size is small, and connections to an external system must be reduced. In particular, the present invention can be easily applied to disposable sensors to which cost competitiveness is important and sensors to which simple electrode connections without a pad process is advantageous in terms of a structure, for example, sensors in which nano-material is applied to all surfaces, and thus there is strong possibility that the present invention can be utilized in the environmental industry using gas sensors, the medical equipment industry requiring the diagnosis of diseases, and the pharmaceutical industry (for example, the new medicine development industry requiring the possibility tests of new medicines).

Furthermore, the present invention can be used in various small-sized sensor chips, such as product identification ID chips equipped with sensors requiring a small size and low costs.

Furthermore, according to the present invention, the size of a semiconductor device can be minimized because there are no pads, and thus there is possibility that, in the case of a device applied when needed other than a device included in a previously manufactured system, the semiconductor device of the present invention can be used as a device whose characteristics can be immediately checked. Accordingly, the present invention can be used in application fields, such as the development of new medicines requiring a large amount of sensing information, and disposable sensors for environmental tests or tests for diseases.

Furthermore, the present invention may be applied in the form of a bare chip other than a package. Accordingly, when the semiconductor of the present invention is manufactured in the form of a small-sized sensor, there can be proposed a new concept-based IC that can perform automatic measurement in such as way as to introduce the IC into a solution or the human body, or environment monitoring and collect it after the passage of a predetermined period.

Furthermore, the present invention proposes the structure of a new semiconductor device, and thus it does not need to undergo processes having the strong possibility of changing the characteristics of electrically conductive material (whose characteristics may be changed into those of an non-conductor, a semiconductor or a conductor depending on the concentration of dopant), such as carbon nano-tubes (CNTs), for example, the process of generating pads and a process performed at high temperature. As a result, the present invention can maintain the characteristics of the electrically conductive material, such as carbon nano-tubes, without change, and thus can achieve the advantage of significantly increasing the reliability of a sensor.

The present invention has been derived from research carried out as part of the Global Frontier Project that has been sponsored by the Korean Ministry of Education, Science and Technology and the National Research Foundation of Korea [Project Management Number: 20110031845; Project Title: Ultra-low Power/Ultra-small Sized Nano-device and Reconfigurable Three-dimensional Integrated System].

While the present invention has been described in conjunction with specific details, such as specific devices, and limited embodiments and diagrams above, these are provided merely to help an overall understanding of the present invention. The present invention is not limited to these embodiments, and various modifications and variations can be made based on the foregoing description by those having ordinary knowledge in the art to which the present invention pertains.

Therefore, the technical spirit of the present invention should not be determined based on only the described embodiments, and the following claims, all equivalents to the claims and equivalent modifications should be construed as falling within the scope of the spirit of the present invention.

What is claimed is:

1. A semiconductor device, comprising:
a first type doped semiconductor substrate;
a second type doped deep well configured such that one or more semiconductor device elements are formed therein, and formed from one surface of the semiconductor substrate to an inside of the semiconductor substrate;
a first type doped first well formed inside a region surrounded by the deep well of the one surface of the semiconductor substrate, and separated from the semiconductor substrate by the deep well;
a first electrical contact formed on a part of the one surface of the semiconductor substrate, and electrically connected to the first well;
a second electrical contact formed on another surface of the semiconductor substrate; and
a first type doped region formed outside a region of the deep well on the one surface of the semiconductor substrate, and electrically connected to a data input/output terminal.

2. The semiconductor device of claim 1, wherein the semiconductor device receives power and also receives and transmits data using the first and second electrical contacts.

3. The semiconductor device of claim 1, wherein the first electrical contact is a metal wire and electrically connected to the first well.

4. The semiconductor device of claim 1, wherein the second electrical contact is a metal plate coated on the semiconductor substrate.

5. The semiconductor device of claim 1, further comprising a capacitor formed between the deep well and the first electrical contact;
wherein the first electrical contact and the second electrical contact are separated by a first p-n junction formed between the semiconductor substrate and the deep well and a second p-n junction formed between the deep well and the first well.

6. The semiconductor device of claim 1, further comprising an insulating layer formed above the one surface of the semiconductor substrate including at least a region in which the deep well is formed.

7. The semiconductor device of claim 6, wherein the insulating layer electrically separates the first electrical contact and the semiconductor substrate.

8. The semiconductor device of claim 1,
wherein the first type doped region formed outside the region of the deep well on the one surface of the semiconductor substrate is electrically connected to the second electrical contact.

9. The semiconductor device of claim 1, further comprising an electrode structure located inside the region of the deep well, and configured to detect chip surface material.

* * * * *